United States Patent
Lee et al.

(10) Patent No.: US 9,454,036 B2
(45) Date of Patent: Sep. 27, 2016

(54) LIGHT EMITTING DIODE ASSEMBLY AND LIQUID CRYSTAL DISPLAY DEVICE INCLUDING THE SAME

(71) Applicant: LG DISPLAY CO., LTD., Seoul (KR)

(72) Inventors: Seo-Yoon Lee, Goyang-si (KR); Min-Su Cho, Paju-si (KR); Myung-Won Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 167 days.

(21) Appl. No.: 14/134,707

(22) Filed: Dec. 19, 2013

(65) Prior Publication Data

US 2014/0368769 A1    Dec. 18, 2014

(30) Foreign Application Priority Data

Jun. 12, 2013 (KR) .................. 10-2013-0066876

(51) Int. Cl.
*G02F 1/1335*    (2006.01)
*F21V 8/00*    (2006.01)
*H01L 27/15*    (2006.01)

(52) U.S. Cl.
CPC ....... *G02F 1/133603* (2013.01); *G02B 6/0026* (2013.01); *G02B 6/0068* (2013.01); *G02B 6/0073* (2013.01); *G02B 6/0083* (2013.01); *G02F 1/133602* (2013.01); *G02F 1/133615* (2013.01); *H01L 27/156* (2013.01)

(58) Field of Classification Search
CPC G02B 6/0026; G02B 6/0083; G02B 6/0068; G02B 6/0073; H01L 27/156; G02F 1/133602; G02F 1/133603; G02F 1/133615
USPC ........................................................... 349/65
See application file for complete search history.

(56) References Cited

U.S. PATENT DOCUMENTS

| | | | |
|---|---|---|---|
| 7,932,969 B2* | 4/2011 | Hong | 349/69 |
| 2009/0303409 A1* | 12/2009 | Park | 349/58 |
| 2010/0165237 A1* | 7/2010 | Jung | 349/58 |
| 2011/0310590 A1* | 12/2011 | Yamashita et al. | 362/97.1 |
| 2011/0316016 A1* | 12/2011 | Lin | 257/91 |
| 2012/0186077 A1* | 7/2012 | Hwu et al. | 29/825 |

FOREIGN PATENT DOCUMENTS

| | | |
|---|---|---|
| CN | 101604088 A | 12/2009 |
| CN | 102023410 A | 4/2011 |
| CN | 102062337 A | 5/2011 |
| CN | 102341640 A | 2/2012 |
| CN | 103022273 A | 4/2013 |
| TW | 201033694 A | 9/2010 |
| TW | 201201354 A | 1/2012 |

OTHER PUBLICATIONS

Office Action dated Mar. 22, 2016 for Chinese Patent Application No. 201310714417.X, 18 pages.

* cited by examiner

*Primary Examiner* — Dung Nguyen
(74) *Attorney, Agent, or Firm* — Brinks Gilson & Lione

(57) ABSTRACT

An LED assembly includes a supporting layer; LED chips arranged on a first surface of the supporting layer and spaced apart from each other; a coating layer formed over the LED chips and including a fluorescent substance, wherein the coating layer changes light emitted from the LED chips into a linear light source; and an electrode pattern layer formed on a second surface of the supporting layer and in selectively removed regions of the supporting layer and contacting the LED chips.

14 Claims, 6 Drawing Sheets

LIGHT EMITTING DIODE ASSEMBLY AND LIQUID CRYSTAL DISPLAY DEVICE INCLUDING THE SAME

The present application claims the benefit of priority to Korean Patent Application No. 10-2013-0066876 filed in the Republic of Korea on Jun. 12, 2013, which is hereby incorporated by reference in their entirety.

BACKGROUND

1. Field of the Disclosure

The present disclosure relates to a light emitting diode assembly and a liquid crystal display device including the same, and more particularly, to a light emitting diode assembly for realizing a liquid crystal display device having a narrow bezel and a slim thickness.

2. Discussion of the Related Art

Liquid crystal display (LCD) devices are widely used as monitors of notebook computers, monitors of personal computers and televisions due to excellent reproduction of moving images and high contrast ratio. LCD devices use the optical anisotropy and polarization properties of liquid crystal molecules of a liquid crystal layer to produce an image.

An LCD device includes two substrates spaced apart from each other and facing each other as well as a liquid crystal layer interposed between the two substrates. The alignment direction of the liquid crystal molecules is controlled by varying the intensity of an electric field applied to the liquid crystal layer, thus changing the transmittance of light through the liquid crystal layer.

The LCD devices require an additional light source because the LCD devices are not self-luminescent. Therefore, a backlight unit is disposed at a rear side of a liquid crystal (LC) panel and emits light into the LC panel to display images.

Backlight units are in general classified as edge type or direct type according to the position of the light source with respect to an LC panel. In edge-type backlight units, a light guide plate is disposed under the LC panel, and one or a pair of lamps are disposed at one side or at each of two sides of the light guide plate. Light from the lamps is refracted and reflected by the light guide plate to be indirectly provided to the LC panel. In direct-type backlight units, a plurality of lamps is disposed directly under the LC panel, and light from the lamps is directly provided to the LC panel.

Backlight units include cold cathode fluorescent lamps (CCFLs), external electrode fluorescent lamps (EEFLs), and light emitting diodes (LEDs) as a light source. Among these, LEDs have been widely used due to their small sizes, low power consumption, and high reliability.

FIG. 1 is a cross-sectional view of illustrating an LCD device according to the related art, and FIG. 2 is a perspective view of illustrating an LED assembly included in the LCD device of FIG. 1.

In FIG. 1, the related art LCD device includes a liquid crystal panel 10 comprising first and second substrates 12 and 14 and a backlight unit 20 at a rear side of the liquid crystal panel 10.

The liquid crystal panel 10 and the backlight unit 20 are modularized with a top cover 40, a support main 30 and a cover bottom 50. Edges of the liquid crystal panel 10 and the backlight unit 20 are surrounded by the support main 30 having a rectangular frame shape. The top cover 40 covers edges of a front surface of the liquid crystal panel 10, and the cover bottom 50 covers a rear surface of the backlight unit 20. The top cover 40 and the cover bottom 50 are combined with the support main 30 to thereby constitute one-united body.

The liquid crystal panel 10 displays images and includes first and second substrates 12 and 14 facing and attached to each other with a liquid crystal layer (not shown) interposed therebetween.

Polarizers 19a and 19b are attached at outer surfaces of the first and second substrates 12 and 14, respectively, and selectively transmit specific light.

The backlight unit 20 includes an LED assembly 29, a reflection sheet 25 over the cover bottom 50, a light guide plate 23 over the reflection sheet 25 and a plurality of optical sheets 21 over the light guide plate 23. As shown in FIG. 2, the LED assembly 29 includes LEDs 29a and a printed circuit board 29b on which the LEDs 29a are mounted with a predetermined distance d between adjacent LEDs 29a.

At this time, circuit patterns 29b-1, which are formed over the printed circuit board 29b, are electrically connected to electrode leads 29a-1, which are formed at both sides of each of the LEDs 29a through solder (not shown).

Meanwhile, light emitted from each of the LEDs 29a is incident on an inside of the light guide plate 23 and is mixed to produce uniform light. At this time, a light mixing length l is required.

That is, the light mixing length l is a length needed to produce uniform light by overlap and mixture of light emitted from each of the LEDs 29a because the LEDs 29a are mounted on the printed circuit board 29b and spaced apart from each other with the predetermined distance therebetween. Within the light mixing length l, hot spots may be caused due to dark areas where the light emitted from the LEDs 29a does not reach, and thus the top cover 40 corresponding to the bezel needs to be extended by the light mixing length l. Accordingly, the bezel width depends on the light mixing length l.

Recently, LCD devices have been required to have a large display area and a narrow bezel. However, the light mixing length l limits the bezel width and the thickness of the LCD devices.

SUMMARY

An LED assembly includes a supporting layer; LED chips arranged on a first surface of the supporting layer and spaced apart from each other; a coating layer formed over the LED chips and including a fluorescent substance, wherein the coating layer changes light emitted from the LED chips into a linear light source; and an electrode pattern layer formed on a second surface of the supporting layer and in selectively removed regions of the supporting layer and contacting the LED chips.

In another aspect, a liquid crystal display device includes a backlight unit including a reflection sheet, a light guide plate over the reflection sheet, an LED assembly at a side of the light guide plate, and optical sheets over the light guide plate; and a liquid crystal panel over the backlight unit and displaying images, wherein the LED assembly includes a supporting layer; LED chips arranged on a first surface of the supporting layer and spaced apart from each other; a coating layer formed over the LED chips and including a fluorescent substance, wherein the coating layer changes light emitted from the LED chips into a linear light source; and an electrode pattern layer formed on a second surface of the supporting layer and in selectively removed regions of the supporting layer and contacting the LED chips.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to the preferred embodiments, examples of which are illustrated in the accompanying drawings.

Figure 3:
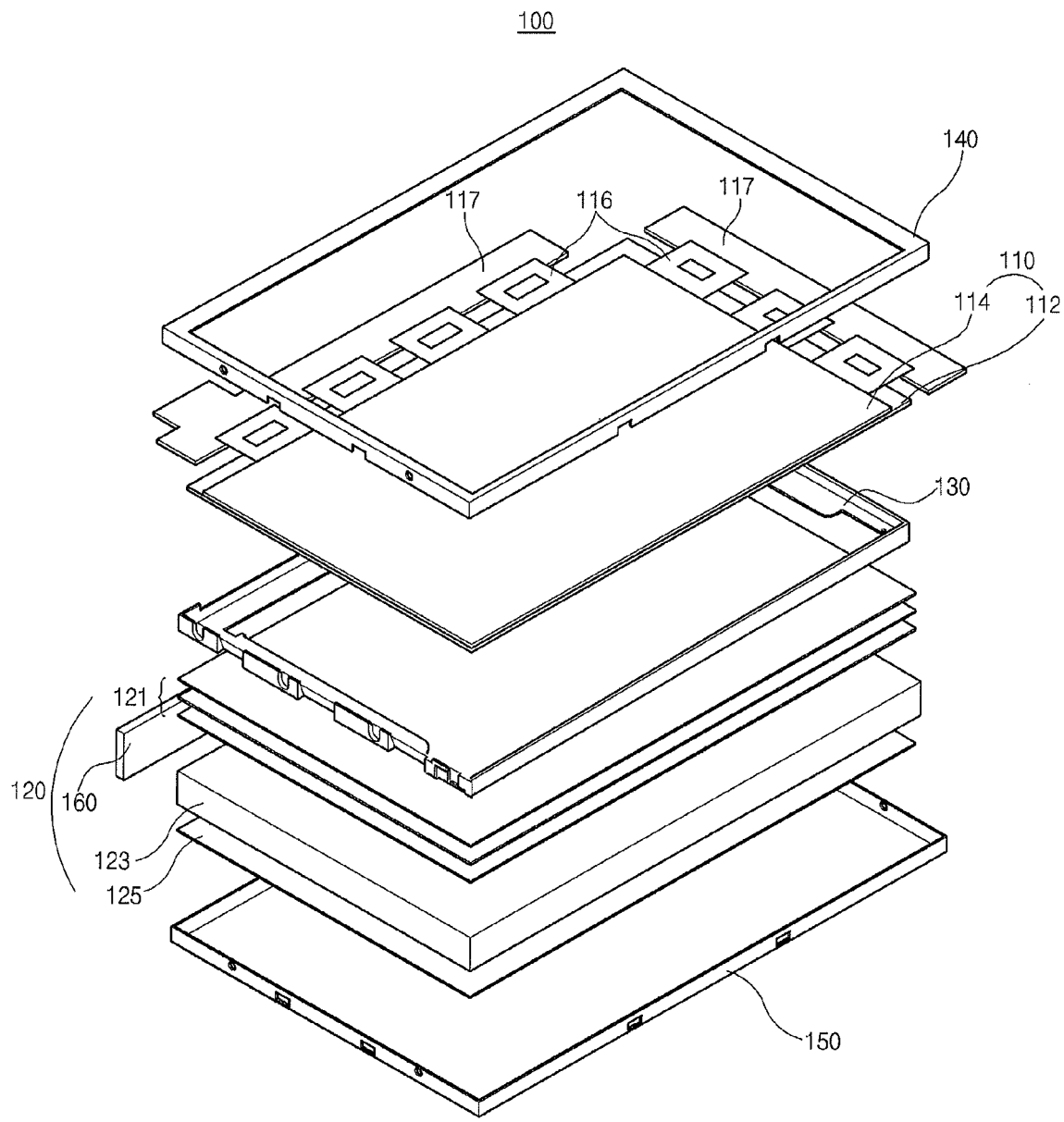
FIG. 3 is an exploded perspective view of an LCD device according to a first embodiment of the present invention.
Figure 4:
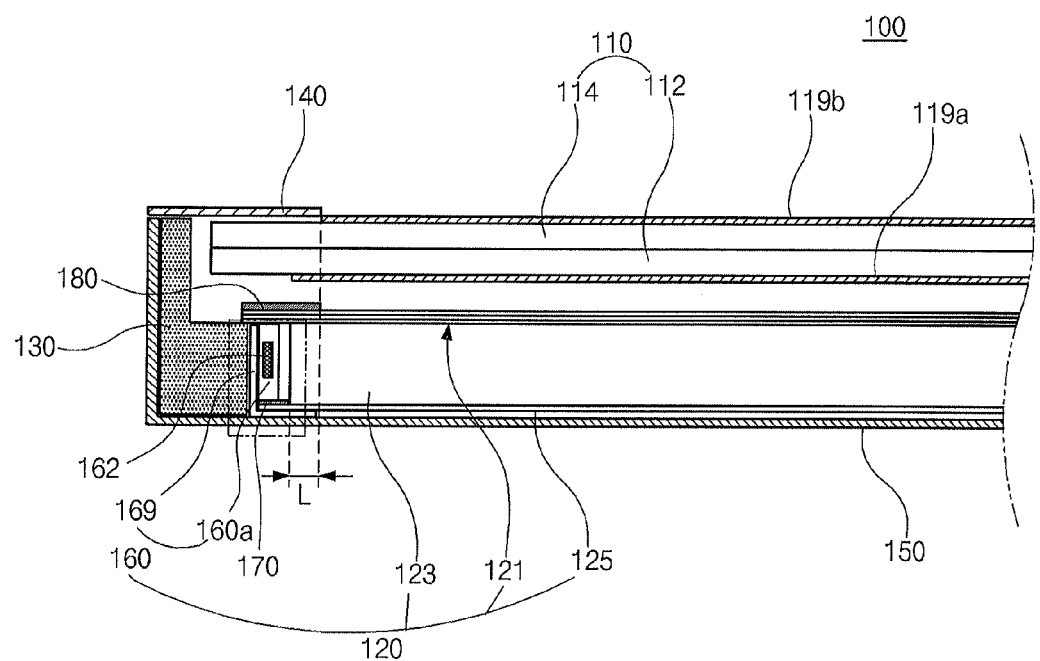
FIG. 4 is a cross-sectional view of illustrating an LCD device according to the first embodiment of the present invention.

FIG. 3 is an exploded perspective view of an LCD device according to a first embodiment of the present invention, and FIG. 4 is a cross-sectional view of illustrating an LCD device according to the first embodiment of the present invention.

In FIG. 3 and FIG. 4, the LCD device 100 according to the first embodiment of the invention includes a liquid crystal panel 110, a backlight unit 120, a support main 130, a top cover 140 and a cover bottom 150.

More particularly, the liquid crystal panel 110 displays images. The liquid crystal panel 110 includes first and second substrates 112 and 114 facing and attached to each other with a liquid crystal layer placed between the first and second substrates 112 and 114. In an active matrix-type (although not shown in the figures), gate lines and data lines are formed on an inner surface of the first substrate 112. The first substrate 112 may also be referred to as a lower substrate or an array substrate. The gate lines and the data lines intersect to define pixel regions. A thin film transistor (TFT) is formed at each crossing point of the gate and data lines, and a pixel electrode is connected to the thin film transistor at each pixel region. The pixel electrode may be formed of a transparent conductive material.

A black matrix and red, green and blue color filter patterns are formed on an inner surface of the second substrate 114. The second substrate may be referred to as an upper substrate or a color filter substrate. The color filter patterns correspond to the pixel regions, respectively. The black matrix surrounds each of the color filter patterns and covers the gate lines, the data lines, and/or the thin film transistors. A transparent common electrode is formed over the color filter patterns and the black matrix. Here, the common electrode may be formed over the first substrate 112.

Polarizers 119a and 119b are attached to outer surfaces of the first and second substrates 112 and 114 and selectively transmit linearly polarized light.

A printed circuit board 117 is attached to at least a side of the liquid crystal panel 110 via connecting means 116 such as flexible printed circuit boards or tape carrier packages (TCPs). The printed circuit board 117 is bent toward a side surface of the support main 130 or a rear surface of the cover bottom 150 during a module assembly process.

In the liquid crystal panel 110, on/off signals from gate driving circuits are provided to the thin film transistors through the gate lines, and when the thin film transistors selected by each gate line turn on, data signals from data driving circuits are provided to the pixel electrodes through the data lines. According to this signal voltage, an electric field is induced between the pixel electrodes and the common electrode, and the arrangement of the liquid crystal molecules is changed by the electric field to thereby change transmittance of light. Therefore, the liquid crystal panel 110 displays variances in the transmittance as images.

The backlight unit 120 is disposed under the liquid crystal panel 110 and provides light to the liquid crystal panel 110 so that the variances in the transmittance of the liquid crystal panel 110 are shown to the outside.

The backlight unit 120 includes a light-emitting diode (LED) assembly 160 disposed along an edge of the support main 130, a reflection sheet 125, a light guide plate 123 over the reflection sheet 125 and with at least one side facing the LED assembly 160, and optical sheets 121 over the light guide plate 123.

Figure 1:
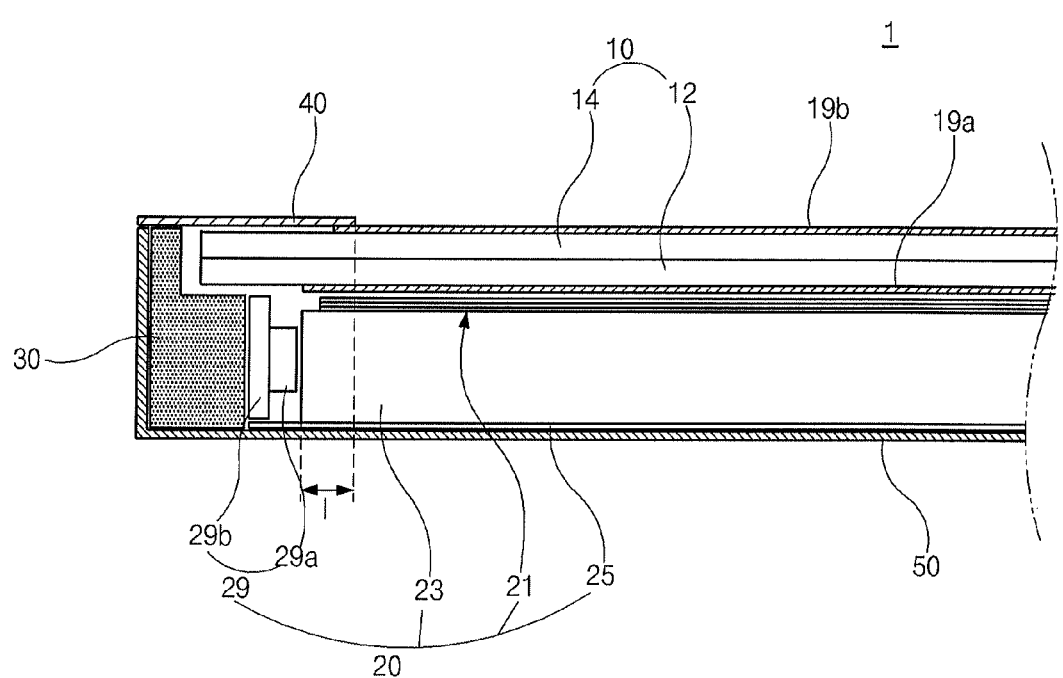
FIG. 1 is a cross-sectional view of illustrating an LCD device according to the related art.
Figure 2:
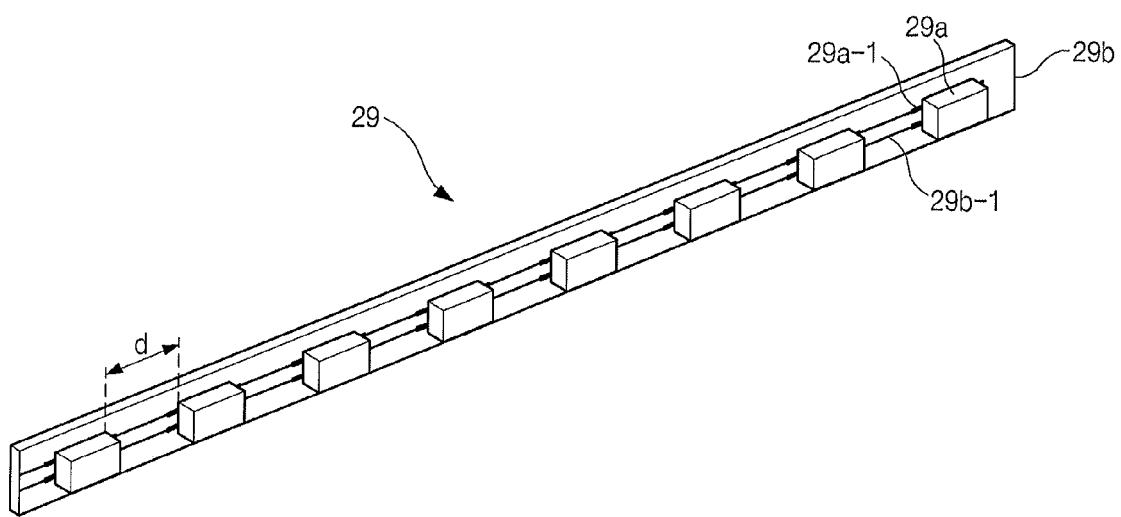
FIG. 2 is a perspective view of illustrating an LED assembly included in the LCD device of FIG. 1.

The LED assembly 160 is formed by uniting the LEDs 29a of FIG. 1 and the printed circuit board 29b of FIG. 1 of the related art as one body and is bar-shaped. The LED assembly 160 functions as a linear light source and emits light at its entire surface.

The LED assembly 160 comprises an LED portion 160a including a plurality of LED chips 162 substantially emitting light and a connecting portion 169 connected to one edge of a rear surface of the LED portion 160a and also connected to a driving unit (not shown) for driving the LED portion 160a. The LED assembly 160 will be described in detail later.

The connecting portion 169 of the LED assembly 160 may be vertically bent and may have an L-like shape such that the rear surface of the LED portion 160a and a part of the reflection sheet 125 are covered.

The connecting portion 169 is connected to the driving unit controlling lightening of the LED chips 162. The connecting portion 169 may include one of a metal printed circuit board, a flame retardant type-4 (FR-4) printed circuit board, a ceramic printed circuit board, and a flexible printed circuit board (FPCB), and beneficially, may include a flexible printed circuit board that is thin and flexible.

Here, the LED assembly 160 of the present invention does not require the electrode leads 29a-1 of FIG. 1 for soldering in the same area as compared with the related art and thus the distance d of FIG. 1 is narrowed. The LED chips 162 are installed more than the LEDs 29a of FIG. 1 mounted on the printed circuit board 29b of the related art. Therefore, the emitting amount of light increases, and a thickness of the light guide plate 123 decreases.

In addition, a substantially entire surface of the LED assembly 160 as well as the LED chips 162 is coated with a fluorescent substance, and light is emitted from the entire surface of the LED assembly 160. Accordingly, a light mixing length L is minimized.

More particularly, in the related art, since the LEDs 29a of FIG. 1 are mounted on the printed circuit board 29b of FIG. 1 with a predetermined distance between adjacent ones, the light mixing length l of FIG. 1 is required such that light emitted from each of the LEDs 29a of FIG. 1 is uniformly mixed and overlapped, and it is difficult to reduce a bezel width. On the other hand, in the present invention, since the LED assembly 160 emits light at its entire surface, efficiency of light incident on the light guide plate 123 increases, and the light mixing length L is minimized. Therefore, the bezel width decreases and the thickness of the light guide plate decreases, thereby reducing a total thickness of the LCD device.

Furthermore, in the related art, the printed circuit board 29b of FIG. 1 is used to fix the LEDs 29a of FIG. 1 spaced apart from each other with the predetermined distance between adjacent ones. However, in the present invention, the board may be partially used for the connecting portion 169 to connect the LED chips 162 and the driving unit (not shown), and the costs for the components may be decreased.

The LED portion 160a of the LED assembly 160 may be fixed by an adhesive pad 170 attached to the reflection sheet 170. Thus, light emitted from the LED chips 162 included in the LED portion 160a is incident on the light guide plate 123 through a light incident surface of the light guide plate 123 and refracted and reflected by the light guide plate 123 to be provided to the liquid crystal panel 110.

Although not shown in the figures, a heat sink plate is disposed at a rear surface of the LED assembly 160 to efficiently discharge heat generated from the LED assembly 160. At this time, the heat sink plate is formed of a metal material having relatively high thermal conductivity. The heat sink plate may have a bar shape like the LED assembly 160 and may be disposed between the LED assembly 160 and the support main 130. Alternatively, the heat sink plate may be vertically bent and have an L-like shape such that the LED assembly 160 is covered with the heat sink plate.

The reflection sheet 125 may have a rectangular plate shape and reflect light passing through the rear surface of the light guide plate 123 toward the liquid crystal panel 110, thereby increasing brightness of light.

The light guide plate 123 totally reflects light emitted from the LED portion 160a several times such that the light moves through the inside of the light guide plate 123 and is uniformly scattered. Accordingly, an initial surface light source is provided to the liquid crystal panel 110.

To provide a uniform surface light source, the light guide plate 123 may include predetermined patterns at its rear surface. Here, to guide the light incident on the inside of the light guide plate 123, the patterns may be elliptical patterns, polygonal patterns or hologram patterns. The patterns may be formed by a printing method or an injecting method.

The light guide plate 123 may be formed of polymethyl methacrylate (PMMA) or polymethacrylstyrene (MS) resin, which is a mixture of polymethyl methacrylate (PMMA) and polystyrene (PS).

The optical sheets 121 over the light guide plate 123 diffuse or concentrate light, which is changed into the surface light source by the light guide plate 123, and provide more uniform surface light source to the liquid crystal panel 110.

The optical sheets 121 may include a diffuser sheet diffusing light, a prism sheet concentrating light, and a protection sheet protecting the prism sheet and additionally diffusing light.

One ends of the optical sheets 121 may overlap the LED assembly 160 of the present invention.

At this time, an opaque tape 180 may be formed over one end of a top sheet of the optical sheets. The tape 180 blocks light outside a display area of the liquid crystal panel 110 and prevents light leakage.

The liquid crystal panel 110 and the backlight unit 120 are combined with the top cover 140, the support main 130 and the cover bottom 150 to form one united body.

The support main 130 surrounds edges of the liquid crystal panel 110 and the backlight unit 120 and separates the liquid crystal panel 110 and the backlight unit 120.

The top cover 140 surrounds edges of a front surface of the liquid crystal panel 110 and has an opening at a front surface of the top cover 140 such that images produced by the liquid crystal panel 110 are displayed through the opening.

The liquid crystal panel 110 and the backlight unit 120 are disposed over the cover bottom 150. The cover bottom 150 is a base for assembling the LCD device 100. The cover bottom 150 includes a bottom wall, on which the backlight unit 120 is disposed and which has a rectangular plate shape, and side walls, which are perpendicularly connected to the bottom wall and cover side surfaces of the support main 130.

Therefore, the edges of the liquid crystal panel 110 and the backlight unit 120 are surrounded by the support main 130 having a rectangular frame shape, the top cover 140 covers the edges of the front surface of the liquid crystal panel 110, and the cover bottom 150 covers the rear surface of the support main 130. The top cover 140 and the cover bottom 150 are combined with the support main 130 to be modularized as one united body.

In the modularized LCD device 100, light emitted from the LED portion 160a of the backlight unit 120 is incident on the light guide plate 123 through the light incident surface, is refracted by the light guide plate 123 toward the liquid crystal panel 110, and is changed into more uniform and higher quality surface light source with light reflected by the reflection sheet 125 while passing through the optical sheets 121, thereby being provided to the liquid crystal panel 110.

The top cover 140 may also be referred to as a case top or a top case. The support main 130 may also be referred to as a guide panel, a main support or a mold frame. The cover bottom 150 may also be referred to as a bottom cover or a lower cover.

Figure 5:
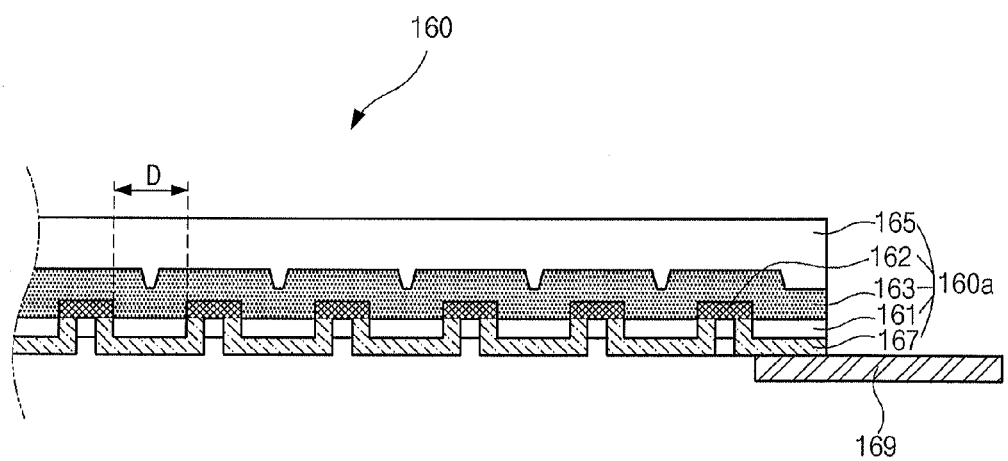
FIG. 5 is a cross-sectional view of illustrating an LED assembly according to the first embodiment of the present invention.
Figure 6:
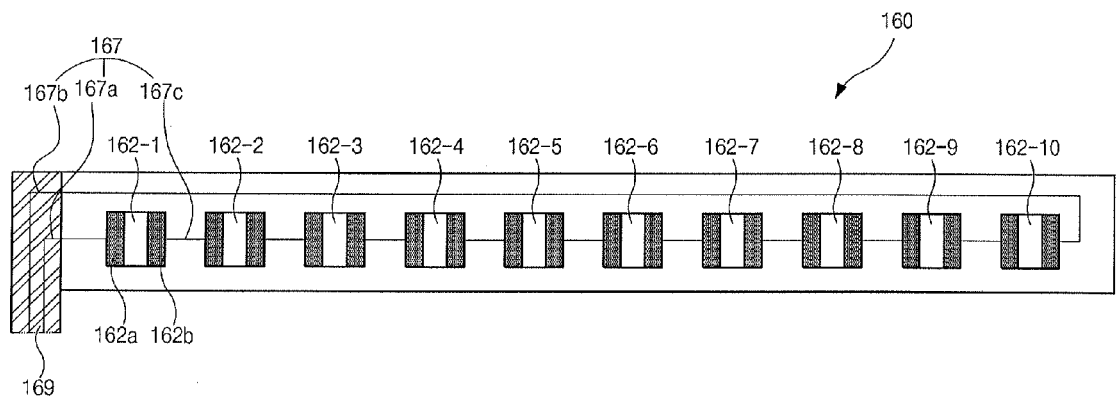
FIG. 6 is a rear view of illustrating a rear side of the LED assembly according to the first embodiment of the present invention.

FIG. 5 is a cross-sectional view of illustrating an LED assembly according to the first embodiment of the present invention, and FIG. 6 is a rear view of illustrating a rear side of the LED assembly according to the first embodiment of the present invention.

In FIG. 5, the LED assembly 160 includes an LED portion 160a substantially emitting light and a connecting portion 169 connected to one edge of a rear surface of the LED portion 160a and also connected to a driving unit (not show) for driving the LED portion 160a.

The LED portion 160a includes a supporting layer 161, a plurality of LED chips 162 disposing on a first surface of the supporting layer 161, a coating layer including a fluorescent substance and covering the LED chips 162, a protection layer 165 protecting the coating layer 163, and an electrode pattern layer 167 formed on a second surface of the supporting layer 161.

The supporting layer 161 functions as a base substrate. The supporting layer 161 may include glass, silicon oxide (SiO2), quartz or sapphire and beneficially may include glass.

The LED chips 162 are arranged on the first surface of the supporting layer 161 with a predetermined distance D between adjacent LED chips 162 in a line. Each of the LED chips 162 includes first and second electrode pads 162a and 162b, which have opposite polarities.

The coating layer 163 may be formed by spray-coating the fluorescent substance all over the supporting layer 161 including the LED chips 162.

The coating layer 163 is formed all over the supporting layer 161 including the LED chips 162 and changes light from the LED chips 161, that is, point light sources into a surface light source.

The protection layer 165 may be formed by applying silicone resin or epoxy resin all over the supporting layer 161 including the coating layer 163 and then curing the resin.

Meanwhile, the coating layer 163 and the protection layer 165 may be formed as a single layer by applying silicone resin or epoxy resin including a fluorescent substance and then curing the resin with UV or heat.

Moreover, a method of forming the coating layer 163 may not be limited to the spray-coating method, and the coating layer 163 may be formed by attaching a fluorescent sheet including a fluorescent substance onto the LED chips 162 through an adhesive material.

The electrode pattern layer 167 may be formed of copper and may be formed on the second surface of the supporting layer 161 and in selectively removed regions of the supporting layer 161. The electrode pattern layer 167 may directly contact the LED chips 162 and connect the LED chips 162.

The LED chips 162, the coating layer 163 and the protection layer 165 are sequentially formed on the first surface of the supporting layer 161, and the supporting layer 161 is selectively removed in regions corresponding to the first and second electrode pads 162a and 162b of each of the LED chips 162.

Then, the electrode pattern layer 167 is formed on the second surface of the supporting layer 161 and in the selectively removed regions of the supporting layer 161. The electrode pattern layer 167 directly contacts the first and second electrode pads 162a and 162b of each of the LED chips 162 and provides the LED chips 162 with electrical signals from an external power supply.

To do this, the electrode pattern layer 167 includes first, second and third line patterns 167a, 167b and 167c. The first and second line patterns 167a and 167b are connected to a positive terminal of the external power supply and a ground, respectively. The third line pattern 167c connects adjacent LED chips 162.

When the LED chips 162 are ten, connection between the LED chips 162 will be described in detail with reference to FIG. 6.

In FIG. 6, the LED chips 162 include first, second, third, fourth, fifth, sixth, seventh, eighth, ninth, and tenth LED chips 162-1, 162-2, 162-3, 162-4, 162-5, 162-6, 162-7, 162-8, 162-9 and 162-10.

The second electrode pad 162b of the first LED chip 162-1 is connected to the first electrode pad 162a of the second LED chip 162-2 through the third line pattern 167c, and the second electrode pad 162b of the second LED chip 162-2 is connected to the first electrode pad 162a of the third LED chip 162-3 through the third line pattern 167c. By repeating connection between adjacent electrode pads 162a and 162b through the third line pattern 167c of the electrode pattern layer 167 as mentioned above, the first to tenth LED chips 162-1, 162-2, 162-3, 162-4, 162-5, 162-6, 162-7, 162-8, 162-9 and 162-10 are connected in series.

In addition, the first electrode pad 162a of the first LED chip 162-1 is connected to the positive terminal of the external power supply through the first line pattern 167a, and the second electrode pad 162b of the tenth LED chip 162-10 is connected to the ground through the second line pattern 167b, thereby being supplied with operating signals. At this time, the first line pattern 167a connected to the first electrode pad 162a of the first LED chip 162-1 and the second line pattern 167b connected to the second electrode pad 162b of the tenth LED chip 162-10 are provided with the operating signals through the connecting portion 169.

The connecting portion 169 may be a board for connecting the LED chips 162 with a driving unit (not shown), which controls light-emitting of the LED chips 162. The connecting portion 169 may be connected to and extended from one edge of the electrode pattern layer 167.

The connecting portion 168 may include one of a metal printed circuit board, a flame retardant type-4 (FR-4) printed circuit board, a ceramic printed circuit board, and a flexible printed circuit board (FPCB), and beneficially, may include a flexible printed circuit board that is thin and flexible.

The LED assembly 160 according to the present invention does not require electrode leads for soldering in the same area as compared with the related art, and thus a distance between adjacent LED chips 162 is decreased. Therefore, the LED chips 162 can be installed more than the related art LEDs mounted on the printed circuit board. In addition, since the substrate including the LED chips 162 is coated with the fluorescent substance all over, and light is emitted from a substantially entire surface of the substrate. Accordingly, an amount of emitted light is increased.

Moreover, in the present invention, the LED chips 162 are connected to the electrode pattern layer 167, and the wire for connecting the LED chip and electrodes in the related art LED is not necessary. Thus, electrical short due to the wire is prevented, and disconnection of the wire by the external impacts is also prevented. In addition, since solder for mounting the LEDs on the printed circuit board is not needed, the manufacturing process of the LED assembly is simplified, the productivity and efficiency are increased, and the manufacturing costs are reduced.

Furthermore, in the related art, the printed circuit board 29b of FIG. 1 is used to fix the LEDs 29a of FIG. 1 with the predetermined distance between adjacent LEDs 29a of FIG. 1. However, in the present invention, the printed circuit board is partially adopted for the connecting portion 169, and costs for the components are decreased.

In the meantime, the LED chips of the LED assembly of the present invention may be divided into several parts, which are independently driven. This will be described with reference to FIG. 7.

Figure 7:
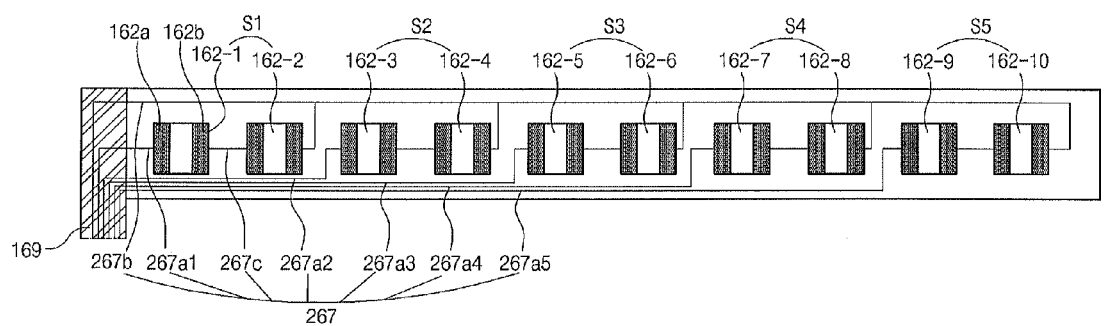
FIG. 7 is a rear view of illustrating a rear side of an LED assembly according to a second embodiment of the present invention.

FIG. 7 is a rear view of illustrating a rear side of an LED assembly according to a second embodiment of the present invention. The same references will be used for the same parts as the structure of FIG. 6, and explanation for the same parts will be omitted.

In FIG. 7, the LED chips 162-1, 162-2, 162-3, 162-4, 162-5, 162-6, 162-7, 162-8, 162-9 and 162-10 are divided into first, second, third, fourth and fifth strings S1, S2, S3, S4 and S5, each of which includes adjacent LED chips connected to each other.

Here, the electrode pattern layer 267 includes first, second, third, fourth, fifth, sixth and seventh line patterns 267a1, 276a2, 267a3, 267a4, 267a5, 267b and 267c. The first, second, third, fourth and fifth line patterns 267a1, 276a2, 267a3, 267a4 and 267a5 independently connect the first, second third, fourth and fifth strings S1, S2, S3, S4 and S5 with the external power supply, respectively. The sixth ling pattern 267b connects the first, second third, fourth and fifth strings S1, S2, S3, S4 and S5 with the ground. The seventh line pattern 267c connects the LED chips of each of the first, second third, fourth and fifth strings S1, S2, S3, S4 and S5.

Therefore, the first LED chip 162-1 and the second LED chip 162-2 are connected to each other through the seventh line pattern 267c to form the first string S1. The third LED chip 162-3 and the fourth LED chip 162-4 are connected to each other through the seventh line pattern 267c to form the second string S2. The fifth LED chip 162-5 and the sixth LED chip 162-6 are connected to each other to form the third string S3. The seventh LED chip 162-7 and the eighth LED chip 162-8 are connected to each other to form the fourth string S4. The ninth LED chip 162-9 and the tenth LED chip 162-10 are connected to each other to form the fifth string S5.

At this time, the first string S1 is supplied with operating signals through the first line pattern 267a1, which connects the positive terminal of the external power supply and the first electrode pad 162a of the first LED chip 162-1, and the sixth line pattern 267b, which connects the ground and the second electrode pad 162b of the second LED chip 162-2. The second string S2 is supplied with operating signals through the second line pattern 267a2, which connects the positive terminal of the external power supply and the first electrode pad 162a of the third LED chip 162-3, and the sixth line pattern 267b, which connects the ground and the second electrode pad 162b of the fourth LED chip 162-4. The third string S3 is supplied with operating signals through the third line pattern 267a3, which connects the positive terminal of the external power supply and the first electrode pad 162a of the fifth LED chip 162-5, and the sixth line pattern 267b, which connects the ground and the second electrode pad 162b of the sixth LED chip 162-6. The fourth string S4 is supplied with operating signals through the fourth line pattern 267a4, which connects the positive terminal of the external power supply and the first electrode pad 162a of the seventh LED chip 162-7, and the sixth line pattern 267b, which connects the ground and the second electrode pad 162b of the eighth LED chip 162-8. The fifth string S5 is supplied with operating signals through the fifth line pattern 267a5, which connects the positive terminal of the external power supply and the first electrode pad 162a of the ninth LED chip 162-9, and the sixth line pattern 267b, which connects the ground and the second electrode pad 162b of the tenth LED chip 162-10.

In the second embodiment of the present invention, since the LED chips are divided into the strings, which are independently supplied with voltages, scan driving, in which the strings may selectively emit light and may be sequentially driven, may be achieved, or local dimming driving, in which the strings may emit light with different brightness from each other, may be realized.

Here, each string includes adjacent LED chips connected to each other. However, the LED chips in each string may be selectively connected to others. For instance, every other LED chips may be connected to each other, and the LED chips may be connected in parallel.

Figure 8:
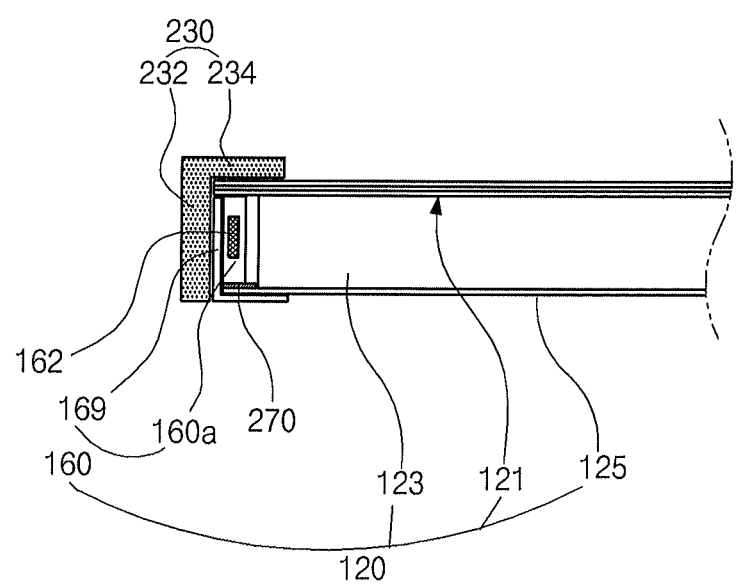
FIG. 8 is a cross-sectional view of illustrating an LCD device according to the second embodiment of the present invention.

FIG. 8 is a cross-sectional view of illustrating an LCD device according to the second embodiment of the present invention. Here, the tape of FIG. 4 is removed, and the support main has a different structure from that of FIG. 4. For convenience of explanation, the liquid crystal panel, the top cover and the cover bottom will be omitted.

In FIG. 8, the support main 230 includes a vertical portion 232 and a horizontal portion 234. The vertical portion 232 surrounds edges of the backlight unit 120, and the horizontal portion 234 is perpendicularly connected to the vertical portion 232 and covers and overlaps an edge of a front surface of the optical sheets 121.

The liquid crystal panel 110 of FIG. 4 is disposed over the horizontal portion 234 of the support main 230. The horizontal portion 234 covers the edge of the front surface of the optical sheets 121 and prevents light emitted from the LED portion 160a of the LED assembly 160 from being leaked outside the display area of the liquid crystal panel 110 of FIG. 4 through the optical sheets 121.

That is, the horizontal portion 234 of the support main 230 separates the liquid crystal panel 110 of FIG. 4 and the backlight unit 120 and blocks light outside the display area of the liquid crystal panel 110, thereby preventing light leakage.

In the present invention, since the LEDs and the printed circuit board are combined as one united body, the distance between adjacent LED chips is decreased, and more than LED chips are mounted. Therefore, the amount of emitted light increases, and LCD devices with high definition and high brightness are obtained.

In addition, the light mixing length is minimized, and LCD devices with a narrow bezel and a slim thickness are achieved.

Moreover, since the LED assembly can be formed through one process, the manufacturing process is simplified and manufacturing costs are decreased.

Furthermore, the printed circuit board is adopted for minimum portions to connect the LED chips and the driving unit, and the costs for the components are reduced.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An LED assembly, comprising:
  a supporting layer;
  a plurality of LED chips arranged on a first surface of the supporting layer and spaced apart from each other;
  a coating layer over the LED chips and including a fluorescent substance, wherein the coating layer changes light emitted from the LED chips into a linear light source; and
  an electrode pattern layer on a second surface of the supporting layer and in selectively removed regions of the supporting layer and contacting the LED chips,
  wherein each of the LED chips includes first and second electrode pads, and the electrode pattern layer directly contacts the first and second electrode pads.

2. The LED assembly according to claim 1, wherein the electrode pattern layer includes copper.

3. The LED assembly according to claim 1, wherein the LED chips are divided into strings, which are independently supplied with voltages, and the strings are driven by a scan driving method, in which the strings selectively emit light and are sequentially driven, or a local dimming driving method, in which the strings emit light with different brightness from each other.

4. The LED assembly according to claim 1, further comprising a protection layer all over the coating layer, wherein the protection layer includes one of a silicone resin or an epoxy resin.

5. The LED assembly according to claim 1, further comprising a connecting portion connected to an edge of an outer surface of the electrode pattern layer.

6. The LED assembly according to claim 5, wherein the connecting portion includes one of a metal printed circuit board, a flame retardant type-4 (FR-4) printed circuit board, a ceramic printed circuit board, and a flexible printed circuit board (FPCB).

7. A liquid crystal display device, comprising:
a backlight unit including a reflection sheet, a light guide plate over the reflection sheet, an LED assembly at a side of the light guide plate, and optical sheets over the light guide plate; and
a liquid crystal panel over the backlight unit and displaying images,
wherein the LED assembly includes a supporting layer; a plurality of LED chips arranged on a first surface of the supporting layer and spaced apart from each other;
a coating layer over the LED chips and including a fluorescent substance, wherein the coating layer changes light emitted from the LED chips into a linear light source; and an electrode pattern layer on a second surface of the supporting layer and in selectively removed regions of the supporting layer and contacting the LED chips,
wherein each of the LED chips includes first and second electrode pads, and the electrode pattern layer directly contacts the first and second electrode pads.

8. The device according to claim 7, wherein the electrode pattern layer includes copper.

9. The device according to claim 7, wherein the LED assembly further includes a connecting portion connected to an edge of an outer surface of the electrode pattern layer.

10. The device according to claim 9, wherein the connecting portion includes one of a metal printed circuit board, a flame retardant type-4 (FR-4) printed circuit board, a ceramic printed circuit board, and a flexible printed circuit board (FPCB).

11. The device according to claim 9, wherein the connecting portion is vertically bent to have an L-like shape such that a rear surface of the LED assembly and a part of the reflection sheet are covered.

12. The device according to claim 7, further comprising a support main including a vertical portion and a horizontal portion, wherein the vertical portion surrounds edges of the backlight unit, and the horizontal is perpendicularly connected to the vertical portion and covers an edge of a front surface of the optical sheets.

13. The device according to claim 12, further comprising an opaque tape, wherein the optical sheets have one ends overlapping the LED assembly, and the opaque tape is disposed over the ends of the optical sheets to prevent light leakage.

14. A liquid crystal display device, comprising:
a backlight unit including a reflection sheet, a light guide plate over the reflection sheet, an LED assembly at a side of the light guide plate, and optical sheets over the light guide plate; and
a liquid crystal panel over the backlight unit and displaying images,
wherein the LED assembly includes a supporting layer, a plurality of LED chips arranged on a first surface of the supporting layer and spaced apart from each other, and a connecting portion connected to an edge of an outer surface of the electrode pattern layer;
a coating layer over the LED chips and including a fluorescent substance, wherein the coating layer changes light emitted from the LED chips into a linear light source; and
an electrode pattern layer on a second surface of the supporting layer and in selectively removed regions of the supporting layer and contacting the LED chips,
wherein the connecting portion is vertically bent to have an L-like shape such that a rear surface of the LED assembly and a part of the reflection sheet are covered.

* * * * *